United States Patent [19]

Sugiyama et al.

[11] Patent Number: 5,158,855
[45] Date of Patent: Oct. 27, 1992

[54] α-DIAZOACETOACETATES AND PHOTOSENSITIVE RESIN COMPOSITIONS CONTAINING THE SAME

[75] Inventors: Hisashi Sugiyama, Yokohama; Kazuo Nate, Machida; Akiko Mizushima, Yokohama; Keisuke Ebata, Hachioji, all of Japan

[73] Assignee: Hitachi, Ltd., Tokyo, Japan

[21] Appl. No.: 247,882

[22] Filed: Sep. 22, 1988

[30] Foreign Application Priority Data

Sep. 24, 1987 [JP] Japan .................. 62-237124
Dec. 14, 1987 [JP] Japan .................. 62-314001
Dec. 14, 1987 [JP] Japan .................. 62-314003
Dec. 14, 1987 [JP] Japan .................. 62-314004
Feb. 29, 1988 [JP] Japan .................. 63-44415

[51] Int. Cl.⁵ .............. G03F 7/023; G03F 7/075; G03F 7/36
[52] U.S. Cl. ................... 430/192; 430/166; 430/189; 430/272; 430/313; 430/193; 534/556
[58] Field of Search ........... 430/193, 189, 192, 191, 430/270, 326, 313, 323, 272; 534/556

[56] References Cited

U.S. PATENT DOCUMENTS

| 4,339,522 | 7/1982 | Balanson et al. | 430/192 |
| 4,400,461 | 8/1983 | Chandross et al. | 430/270 |
| 4,622,283 | 11/1986 | Gray | 430/191 |
| 4,624,908 | 11/1986 | Schwartzkopf | 430/192 |
| 4,626,491 | 12/1986 | Gray | 430/190 |

OTHER PUBLICATIONS

Willson, C. Grant et al., "New Diazoketone Dissolution Inhibitors for Deep UV Photolithography", *SPIE vol. 771 Advances in Resist Techl. & Proc.*, 1987, pp. 2-10.
IEEE Transactions on Electron Devices, vol. ED-28, No. 11 pp. 1300-1305 (1981).

*Primary Examiner*—Charles L. Bowers, Jr.
*Assistant Examiner*—John S. Chu
*Attorney, Agent, or Firm*—Fay, Sharpe, Beall, Fagan, Minnich & McKee

[57] ABSTRACT

An α-diazoacetoacetic acid ester derived from cholic acid, deoxycholic acid, lithocholic acid or a derivative thereof is effective as a sensitizer in a photosensitive resin composition containing an alkali-soluble resin to form a resist for lithography using KrF excimer laser.

12 Claims, No Drawings

α-DIAZOACETOACETATES AND PHOTOSENSITIVE RESIN COMPOSITIONS CONTAINING THE SAME

BACKGROUND OF THE INVENTION

This invention relates to α-diazoacetoacetates remarkably useful as a photosensitizer, precursors thereof, and photosensitive resin compositions prepared with the α-diazoacetoacetates suitable for lithography using KrF excimer laser (249 nm).

Diazoketone compounds containing one or more aromatic rings have been used as a sensitizer sensitive to a light (300 nm or more) in a resist. But these compounds are generally poor in sensitivity to a light of less than 300 nm. On the other hand, 5-diazo-Meldrum's acid and derivatives thereof which do not possess any aromatic rings are sensitive to a light of 300 nm or less [B.D. Grant et al.: IEEE Transactions on Electron Devices, vol. ED-28, No. 11, pp. 1300–1305 (1981)]. The 5-diazo-Meldrum's acid and derivatives thereof are excellent in bleaching but poor in solubility with a problem of having subliming properties.

Therefore, practically usable sensitizers overcoming the defects of known compounds have been desired.

SUMMARY OF THE INVENTION

It is an object of the present invention to provide diazoketone compounds overcoming the defects mentioned above, excellent in bleaching and solubility without sublimation, and sensitive to a light of 300 nm or less.

It is another object of the present invention to provide precursors of such diazoketone compounds.

It is a further object of the present invention to provide photosensitive resin compositions prepared with such diazoketone compounds suitable for lithography using KrF excimer laser (249 nm).

The present invention provides α-diazoacetoacetic acid esters derived from cholic acid, deoxycholic acid or lithocholic acid and represented by the formula:

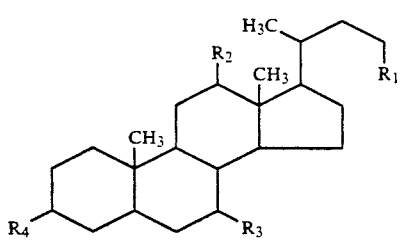
(I)

wherein $R_1$ is $-CO_2R_9$ (in which $R_9$ is an alkyl group having 1 to 10 carbon atoms), or

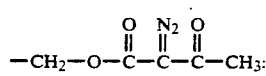

$R_2$, $R_3$ and $R_4$ are independently hydrogen, $-OH$ or

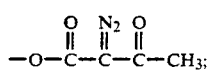

provided that at least one of $R_1$ through $R_4$ contains the moiety of the formula:

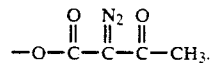

The present invention also provides precursors of α-diazoacetoacetic acid esters derived from cholic acid, deoxycholic acid, lithocholic acid and represented by the formula:

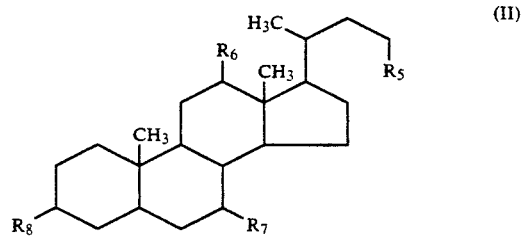
(II)

wherein $R_5$ is $-CO_2R_9$ (in which $R_9$ is an alkyl group having 1 to 10 carbon atoms), or

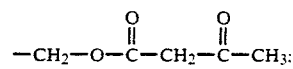

$R_6$, $R_7$ and $R_8$ are independently hydrogen, $-OH$ or

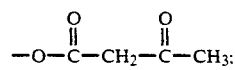

provided that at least one of $R_5$ through $R_8$ contains the moiety of the formula:

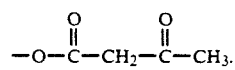

The present invention further provides photosensitive resin compositions comprising alkali-soluble resins and α-diazoacetoacetic acid esters of the formula (I) as a sensitizer.

DESCRIPTION OF THE PREFERRED EMBODIMENTS

The α-diazoacetoacetatic acid esters of the present invention is obtained by using cholic acid, deoxycholic acid or lithocholic acid as a starting material and represented by the formula:

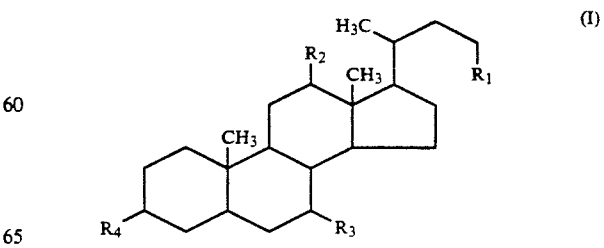
(I)

wherein $R_1$ is $-CO_2R_9$ (in which $R_9$ is an alkyl group having 1 to 10 carbon atoms), or

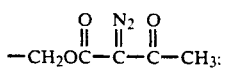

R$_2$, R$_3$ and R$_4$ are independently hydrogen, —OH or

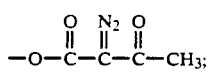

provided that at least one of R$_1$ through R$_4$ contains the moiety of the formula:

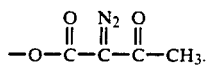

Preferable combinations of substituents at R$_1$ through R$_4$ are shown in Table 1.

TABLE 1

| R$_1$ | R$_2$ | R$_3$ | R$_4$ |
|---|---|---|---|
| —CO$_2$CH$_3$, | —O—C(=O)—C(=N$_2$)—C(=O)—CH$_3$, | —O—C(=O)—C(=N$_2$)—C(=O)—CH$_3$, | —O—C(=O)—C(=N$_2$)—C(=O)—CH$_3$, |
| —CO$_2$CH$_3$, | —O—C(=O)—C(=N$_2$)—C(=O)—CH$_3$, | —OH, | —O—C(=O)—C(=N$_2$)—C(=O)—CH$_3$, |
| —CO$_2$CH$_3$, | —OH, | —O—C(=O)—C(=N$_2$)—C(=O)—CH$_3$, | —O—C(=O)—C(=N$_2$)—C(=O)—CH$_3$, |
| —CO$_2$CH$_3$, | —OH, | —OH, | —O—C(=O)—C(=N$_2$)—C(=O)—CH$_3$, |
| —CO$_2$CH$_2$CH$_2$CH$_3$, | —O—C(=O)—C(=N$_2$)—C(=O)—CH$_3$, | —O—C(=O)—C(=N$_2$)—C(=O)—CH$_3$, | —O—C(=O)—C(=N$_2$)—C(=O)—CH$_3$, |
| —CO$_2$CH$_3$, | —H, | —H, | —O—C(=O)—C(=N$_2$)—C(=O)—CH$_3$, |
| —CO$_2$CH$_2$CH$_3$, | —O—C(=O)—C(=N$_2$)—C(=O)—CH$_3$, | —O—C(=O)—C(=N$_2$)—C(=O)—CH$_3$, | —O—C(=O)—C(=N$_2$)—C(=O)—CH$_3$, |
| —CO$_2$—C$_6$H$_{11}$, | —O—C(=O)—C(=N$_2$)—C(=O)—CH$_3$, | —O—C(=O)—C(=N$_2$)—C(=O)—CH$_3$, | —O—C(=O)—C(=N$_2$)—C(=O)—CH$_3$, |
| —CH$_2$O—C(=O)—C(=N$_2$)—C(=O)—CH$_3$, | —O—C(=O)—C(=N$_2$)—C(=O)—CH$_3$, | —O—C(=O)—C(=N$_2$)—C(=O)—CH$_3$, | —O—C(=O)—C(=N$_2$)—C(=O)—CH$_3$, |
| —CH$_2$O—C(=O)—C(=N$_2$)—C(=O)—CH$_3$, | —H, | —H, | —O—C(=O)—C(=N$_2$)—C(=O)—CH$_3$, |

The α-diazoacetoacetic acid esters of the formula (I) can also be represented by the formulae (I-1) to (I-3) mentioned below depending on starting materials used:

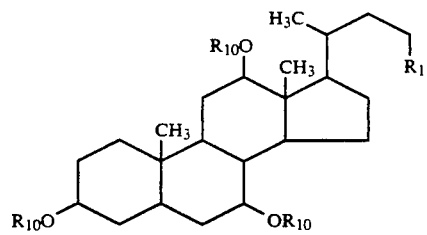

(I-1)

(I-2)

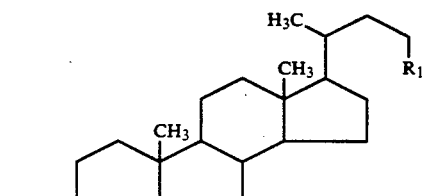

(I-3)

wherein $R_1$ is as defined above; and $R_{10}$ is hydrogen, or

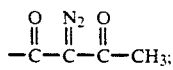

provided that at least one of $R_1$ and $R_{10}$ should contain the moiety of the formula:

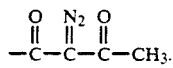

The α-diazoacetoacetic acid esters of the formula (I) can be synthesized as follows.

As a starting material, there can be used esters of cholic acid, deoxycholic acid or lithocholic acid, or reduced forms of these acids.

The starting material is subjected to an ester exchange reaction wherein at least one —OH moiety is reacted with an acetoacetic acid ester in the presence of an acid catalyst. As the acid catalyst, there can be used sulfuric acid, p-toluenesulfonic acid, sodium acetate, etc., to form a precursor of the formula:

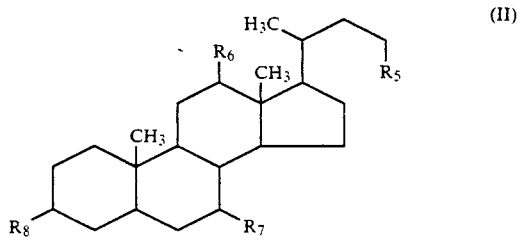

wherein $R_5$ is —$CO_2R_9$ (in which $R_9$ is an alkyl group having 1 to 10 carbon atoms), or

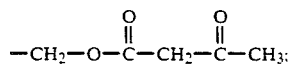

$R_6$, $R_7$ and $R_8$ are independently hydrogen, —OH or

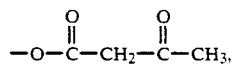

provided at least one of $R_5$ through $R_8$ contains the moiety of the formula:

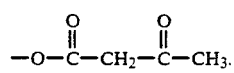

Alternatively, the precursors of the formula (II) can be formed by reacting the starting materials with diketene in an amount of preferably 1 to 1.2 mole equivalent per OH group of the starting material in the presence of an acid catalyst in an organic solvent with heating.

As the acid catalyst, the same ones as used in the ester exchange reaction can be used. As the organic solvent, there can be used p-dioxane, etc.

The precursor of the formula (II) containing at least one acetoacetic acid ester group of the formula:

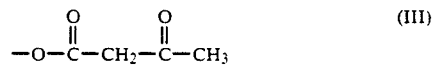

is reacted with p-toluenesulfonylazide and an amine at room temperature to produce an o-diazoacetoacetic acid ester of the formula (I) wherein the acetoacetic acid ester groups are converted to α-diazoacetoacetic acid ester groups of the formula:

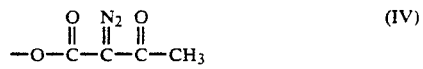

As the amine, there can preferably be used secondary and tertiary amines such as triethylamine, diethylamine, and the like.

The processes described in Organic Syntheses, vol. 42, p. 28 (1962) can be applied to the above-mentioned synthesis method.

The α-diazoacetoacetic acid ester of the formula (I) has light absorption of ε=about 7000 at about 260 nm per one α-diazoacetoacetic acid ester group of the formula (IV), which functions as a photosensitive group. Thus when exposed to light of 300 nm or less, the group of the formula (IV) is changed to a carboxylic acid to reduce the ε value, for example, to about 900, which results in showing great bleaching with good efficiency. Further, the α-diazoacetoacetic acid esters of the formula (I) are excellent in solubility due to the steroid skeleton and can easily be dissolved in an ordinary organic solvent such as ether series, ketone series, alcohol series and halogen-containing organic solvents. In addition, it does not sublime due to the presence of the steroid skeleton.

Therefore, the α-diazoacetoacetic acid esters of the formula (I) can be used as a photosensitive material, for example, as a sensitizer in a photoresist. Further, since it can form a film by using a composition obtained by mixing with a resin or the like, it is very useful.

More in detail, the α-diazoacetoacetic acid esters of the formula (I) is useful as a photosensitive dissolution inhibiting agent (a sensitizer) in a photoresist for KrF excimer laser (249 nm).

Recently, a 1/5 or 1/10 projection aligner using a KrF excimer laser (249 nm) light has been noticed as a effective lithography techinque for obtaining resolution of line width of 0.5 μm or less necessary for producing semiconductor elements of 16 Mb DRAM and the like. This technique uses a light having a shorter wavelength than UV light in order to increase the degree of resolution. When the wavelength of used light becomes shorter, particularly 300 nm or less, there arise various serious problems in heretofore known resist materials.

Resist materials generally comprise a photosensitive dissolution inhibiting agent (or a sensitizer) and a matrix polymer.

The photosensitive dissolution inhibiting agent used for KrF excimer laser resist is required to have properties of (i) having a large absorption of a light of 249 nm, (ii) having a large quantum yield of photoreaction, and (iii) to make the photoreaction product not to have an absorption at 249 nm, as well as to have a large difference in alkali dissolution inhibiting effect before and after the photoreaction, and to have a large compatibility with the matrix polymer.

Naphthoquinone diazidosulfonic acid ester used for UV as a sensitizer does not satisfy the requirement (iii) due to having an aromatic ring in the molecule. Thus, it cannot be used for KrF excimer laser. It is necessary for the photoreaction product to have no light absorption at 249 nm.

In this respect, the o-diazoacetoacetic acid ester of the formula (I) satisfies the required properties of (i), (ii) and (iii). Particularly, compounds of the formulae (I-1) through (I-3) can be used alone or as a mixture thereof.

On the other hand, the matrix polymer used for a KrF excimer laser resist is required to have properties of (i) having large light transmission at 249 nm and (ii) having great resistance to reactive ion etching (RIE). Considering the requirement (i) only, copolymers of methacrylic acid and methyl methacrylate are excellent in the light transmission, but insufficient for the resistance to RIE. In order to improve the resistance to RIE, it is necessary to introduce aromatic rings into the matrix polymer. In contrast, considering the requirement (ii) only, cresol novolac resins are good, but are poor in the light transmission at 249 nm. In order to improve the light transmission, it is necessary to reduce the number of aromatic rings in the matrix polymer.

As mentioned above, since a number of aromatic rings necessary for improving the resistance to RIE damage the light transmission at 249 nm, it is very difficult to satisfy the requirements (i) and (ii) simultaneously. But the introduction of aromatic rings into the matrix polymer is essential in any coses.

Suitable matrix polymers satisfying the abovementioned requirements are alkali-soluble resins, preferably containing aromatic rings therein.

Examples of the alkali-soluble resins containing aromatic rings therein are those represented by the formulae:

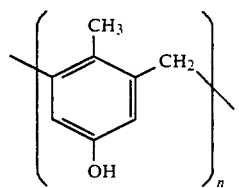
(V)

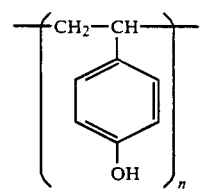
(VI)

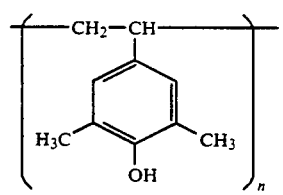
(VII)

wherein n is an integer of 4 or more, preferably 4 to 80.

These resins are excellent in light transmission at 249 nm. Films of 1 μm thick made from these resins have a light transmission of 50% or more. Reasons for this are not clear, but the substitution form of benzene rings is symmetrical as to the molecular axis passing the OH group. These resins of the formulae (V) to (VII) can be used alone or as a mixture thereof.

As mentioned above, a photosensitive resin composition comprising an α-diazoacetoacetic acid ester of the formula (I) and at least one member selected from the group consisting of alkali-soluble resins containing aromatic rings therein and represented by the formulae (V) to (VII) can be used as a photoresist for KrF excimer laser satisfying all the properties of sensitivity, degree of resolution, and resistance to RIE.

Further since this resin composition is an alkali developable positive resist due to containing alkali-soluble resins, the process for alkali developable positive resist widely used now can be employed without any change.

The above-mentioned photosensitive resin compositions are excellent in the properties as mentioned above compared with known photosensitive resin compositions.

For example, a widely practically used novolac type resist (a composition comprising a novolac resin as a matrix polymer and a naphthoquinone diazidosulfonic acid ester as a sensitizer) is poor in light transmission at 249 nm not to make exposed light reach the bottom of the resist because of containing aromatic rings both in the matrix polymer and the sensitizer. Further, there brings about no bleaching of the sensitizer for providing high resolution. Therefore, if this resist is used for KrF excimer laser, there is obtained no good pattern.

In the photosensitive resin composition of the present invention, the alkali-soluble resin containing aromatic rings (the formulae (V) to (VII)) is used in an amount of preferably 50 to 95 parts by weight, more preferably 70 to 90 parts by weight, and the α-diazoacetoacetic acid ester of the formula (I) is used in an amount of preferably 50 to 5 parts by weight, more preferably 30 to 10 parts by weight.

The photosensitive resin composition can be applied to forming the desired pattern as follows.

The photosensitive resin composition is dissolved in an organic solvent conventionally used such as ethyl Cellosolve acetate, cyclohexanone, isoamyl acetate, etc., and spin-coated on a silicon wafer, followed by prebaking at a suitable temperature (e.g. 80 to 120° C.) to give a film. Then, KrF excimer laser light is irradiated to form the desired patterns. After developing with a conventional alkali aqueous solution, there can be obtained positive patterns with good shape. The formed patterns show excellent resistance to RIE such as CF$_4$ RIE, etc. and are excellent as an etching mask.

On the other hand, when an alkali-soluble organosilicon resin is used as the matrix polymer in the photosensitive resin composition, the resulting photosensitive resin composition is suitable for use as a photoresist for KrF excimer laser in the so-called bi-layer resist method.

As the alkali-soluble organosilicon resin, there can be used those containing a silicon atom in a main chain and an organic group containing phenolic hydroxyl group(s) in a part or all of side chains, said organic group containing hydroxyl group(s) is symmetrical to a plane crossing perpendicularly a benzene plane. Such organosilicon resins can be represented by the formulae:

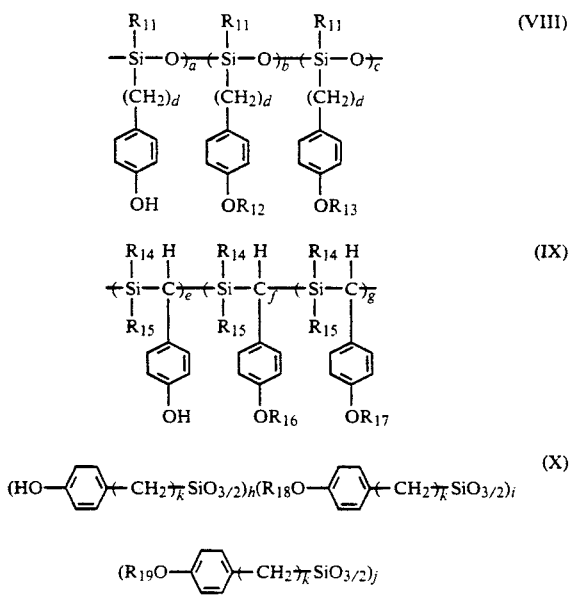

wherein $R_{11}$, $R_{12}$, $R_{14}$, $R_{15}$, $R_{16}$ and $R_{18}$ are independently an alkyl group having 1 to 6 carbon atoms; $R_{13}$, $R_{17}$ and $R_{19}$ are independently a trialkylsilyl group; d and k are independently 1 or 2; a, e and h are independently an integer of 1 or more (not including zero); and b, c, f, g, i and j are independently zero or an integer of 1 or more, provided that $a/(a+b+c)$, $e/(e+f+g)$ and $h/(h+i+j)$ are 0.4 or more.

The above mentioned alkali-soluble organosilicon resins are excellent in resistance to $O_2$ RIE since the matrix polymers contain silicon atoms in the main chain, and are soluble in an alkali solution due to having an organic group containing phenolic hydroxyl groups in side chains. Further, the light transmission at 249 nm is improved remarkably and is about 70% when a film thickness is 1 μm. This seems to be caused by the fact that the organic group in side chains containing hydroxyl groups is symmetrial to a plane crossing perpendicularly a benzene plane. As mentioned above, the photosensitive resin composition containing the alkali-soluble organosilicon resin as a matrix resin and α-diazoacetoacetates of formula (I) as a sensitizer is excellent in sensitivity, resolution and resistance to $O_2$ RIE, so that it can be used as a KrF excimer laser resist for the bi-layer resist method.

The photosensitive resin composition comprises preferably 60 to 95 parts by weight, more preferably 70 to 90 parts by weight, of the alkali-soluble organosilicon resin and preferably 40 to 5 parts by weight, more preferably 30 to 10 parts by weight of the α-diazoacetoacetic acid ester of the formula (I).

Such a resin composition can be applied to the formation of a pattern on semiconductor elements and the like as follows.

The photosensitive resin composition is dissolved in a conventionally used organic solvent such as ethyl Cellosolve acetate and spin-coated on a bottom resist layer in the bi-layer resist method, followed by prebaking at a suitable temperature (e.g. 80 to 120° C.) to form a film of 0.2 to 1.0 μm thick. KrF excimer laser light is irradiated on the film to form the desired pattern. Then, irradiated portions are selectively dissolved by using an alkali developing solution such as an aqueous solution of tetrakis(2-hydroxyethyl)ammonium hydroxide to give positive resist patterns. The bottom resist layer is then subjected to dry etching with O2 plasma using the resulting resist pattern as a mask. The resulting patterns have a high aspect ratio.

In the above-mentioned photosensitive resin composition, since the alkali-soluble organosilicon resin is used, the resistance to $O_2$ RIE is excellent and the light transmission at 249 nm is also excellent, which results in improving the sensitivity and the resolution. Further, the α-diazoacetoacetic acid ester of the formula (I) is subjected to a photoreaction by a light of 249 nm with good efficiency and the reaction product has no light absorption at 249 nm, so that good bleaching is obtained to improve the sensitivity and the resolution. Since the two components are used in the photosensitive resin composition, the sensitivity, the resolution and the resistance to $O_2$ RIE necessary for the KrF excimer laser resist for the bi-layer resist method can be satisfied simultaneously.

The present invention is illustrated by way of the following Examples, in which all parts and percents are by weight unless otherwise specified.

EXAMPLE 1

Synthesis of

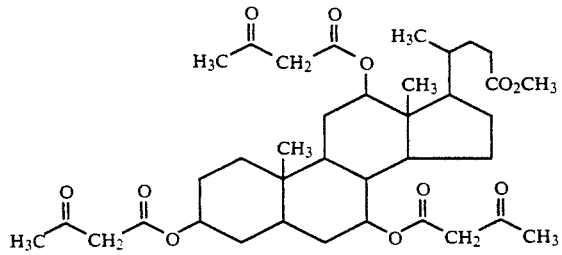

In a 100-ml three-necked flask equipped with a reflux condenser, a dropping funnel and a stirrer, 2.11 g (5.00 mmoles) of methyl cholate, 10 ml of 1,4-dioxane, and 0.14 g of p-toluenesulfonic acid hydrate were placed and refluxed with heating. Then, 10 ml of 1,4-dioxane solution coutaining 1.68 g (2.00 mmoles) of diketene was added dropwise over 40 minutes and aged for 4 hours. After the reaction, the solvent was removed by distillation under reduced pressure. The residue was dissolved in diethyl, ether and then washed with water and saturated saline solution. After drying over anhydrous sodium sulfate, the diethyl ether was removed by distillation, followed by the separation of the desired compound by column chromatography in yield of 1.56 g (60.5% yield). NMR spectrum (60 MHz, CDCl3): A (δ 2.17, 2.20;

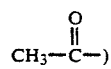

B (δ 3.32, 3.36, 3.41;

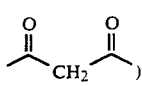

C (δ 3.53;

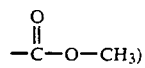

Intensity ratio A:B:C=3:2:1
IR spectrum: 1700 cm$^{-1}$, $\gamma$C=0

EXAMPLE 2

Synthesis of

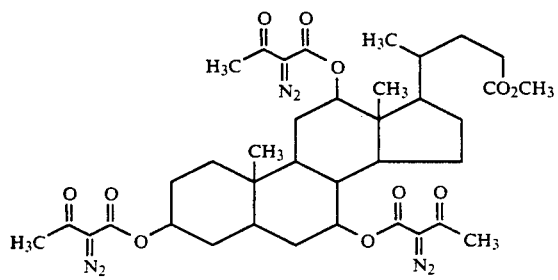

In a two-necked flask equipped with a reflux condenser and a stirrer, 1.56 g (2.31 mmoles) of the precurror obtained in Example 1, 0.77 g (7.62 mmoles) of triethylamine and 10 ml of acetonitrile were placed, and to the resulting mixture, 5 ml of acetonitrile solution containing 1.50 g (7.62 mmoles) of p-toluenesulfonylazide was added dropwise. After stirring at room temperature for 2 hours, the solvent was removed by distillation under reduced pressure, followed by extraction with diethyl ether. The diethyl ether solution was washed with an aqueous solution of potassium hydroxide and a saturated saline solution, and dried over anhydrous sodium sulfate. After removing the diethyl ether by distillation under reduced pressure, the desired compound having a melting point of 139° C. was obtained by recrystallization from ethanol in yield of 1.38 g (80.0% yield).

NMR spectrum (60 MHz, CDCl$_3$): A ($\delta$ 2.42, 2.46;

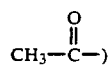

B ($\delta$ 3.60:

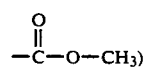

Intensity ratio A:B=3:1

IR spectrum: A (2160 cm$^-$; $\gamma$C=N$_2$), A (1730 cm$^{-1}$, 1675 cm$^-$; $\gamma$C=0)

UV spectrum (in THF): $\lambda$max 258 nm, $\epsilon$ 24,300

EXAMPLE 3

Synthesis of

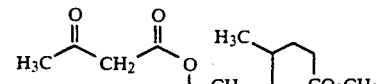

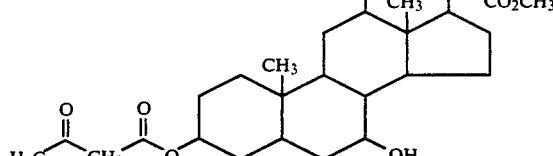

or

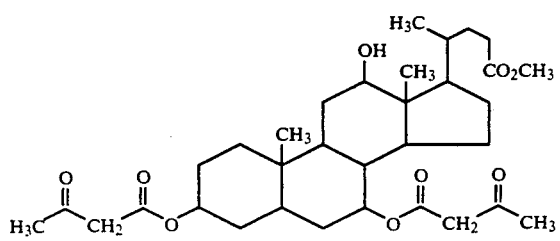

The process of Example 1 was repeated exept for using 2.2 mole equivalent of diketene per mole equivalent of methyl cholate to give the desired compound.

EXAMPLE 4

Synthesis of

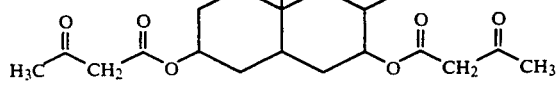

or

The process of Example 2 was repeated except for using the precursor obtained in Example 3 to give the desired compound.

EXAMPLE 5

Synthesis of

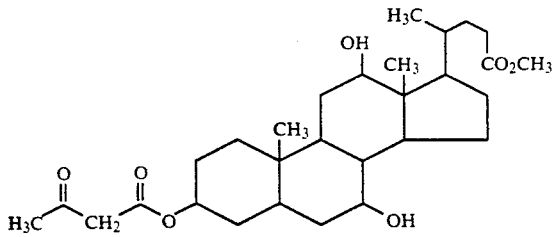

The process of Example 1 was repeated except for using 1.1 mole equivalent of diketene per mole equivalent of methyl chlate to give the desired compound.

EXAMPLE 6

Synthesis of

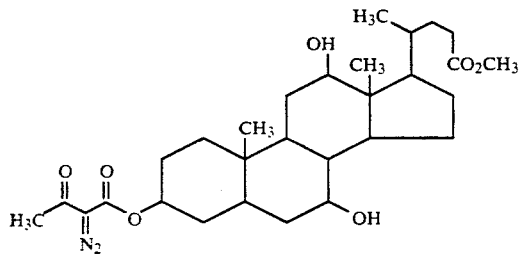

The process of Example 2 was repeated except for using the precursor obtained in Example 5 to give the desired compound.

EXAMPLE 7

Synthesis of

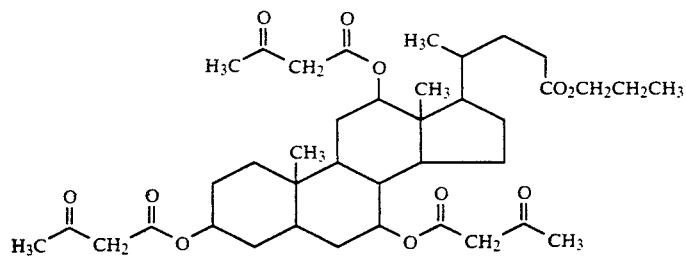

The process of Example 1 was repeated except for using 5.11 g (11.3 mmoles) of n-propyl cholate, 3.81 g (45.4 mmoles) of diketene and 0.44 g of p-toluenesulfonic acid hydrate to give the desired compound.

EXAMPLE 8

Synthesis of

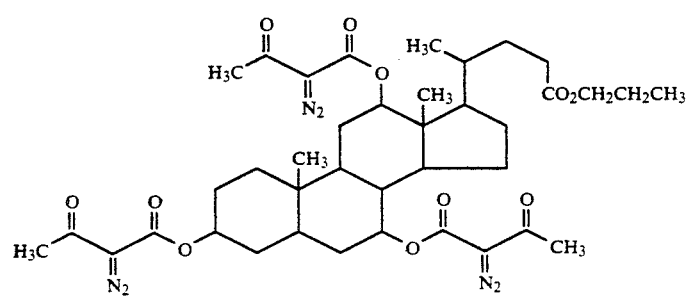

The diazotization of Example 2 was repeated except that the precursor obtained in Example 7 was not separated by column chromatography and reacted with 6.09 g (30.9 mmoles) of p-toluenesulfonylazide and 3.14 g (30.9 mmoles) of triethylamine. Then, the reaction residue was recrystallized from a mixed solvent of ethyl acetate and n-hexane to give the desired compound having a melting point of 110° to 112° C. in yield of 4.56 g (63.0% yield).

NMR spectrum (60 MHz, CDCl$_3$): A (δ 2.38, 2.43;

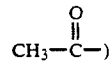

B (δ 3.92, triplet (6 Hz);

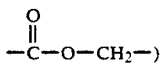

Intensity ratio A:B=9:2

IR spectrum: A (2160 cm$^-$; $\gamma$C=N$_2$) B (1720 cm$^{-1}$, 1680 cm$^-$; $\gamma$C=O)

UV spectrum (in THF): λmax 258 nm, ε 23,800

EXAMPLE 9

Synthesis of

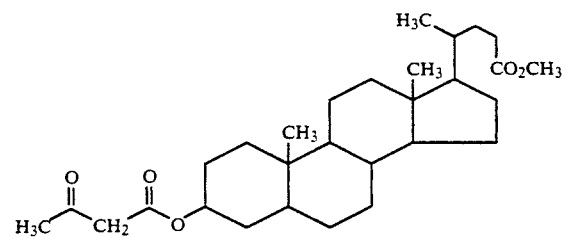

The process of Example 1 was repeated except for reacting 1.95 g (5.00 mmoles) of methyl lithocholate, and 0.50 g (6.0 mmoles) of diketene, in 57 mg of p-toluenesulfonic acid hydrate and 8 ml of 1,2-dichloroethane, and recrystallizing the residue from methanol to give the desired compound having a melting point of 184° to 189° C. in yield of 1.44 g (60.7% yield).

EXAMPLE 10

Synthesis of

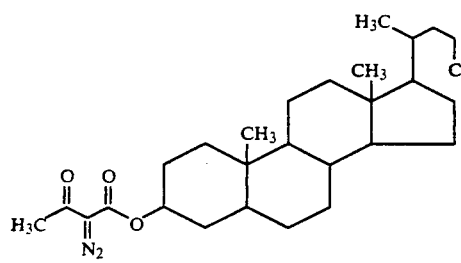

The diazotization of Example 2 was repeated except for reacting the precursor obtained in Example 9 with 0.60 g (3.0 mmoles) of p-toluenesulfonylazide and 0.31 g (3.0 mmoles) of triethylamine. Then, the reaction residue was subjected to column chromatography to separate the desired compound in yield of 1.12 g (75.0% yield).

NMR spectrum (60 MHz, CCl$_4$): A ($\delta$ 2.30;

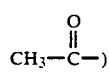

B ($\delta$ 3.48;

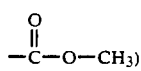

Intensity ratio A:B = 1:1

IR spectrum: A (2160 cm$^{-1}$; $\gamma$C=N$_2$) B (1755 cm$^{-1}$, 1730 cm$^{-1}$, 1670 cm$^{-1}$, $\gamma$C=O)

UV spectrum (in THF): $\lambda$max 258 nm, $\epsilon$ 6600

EXAMPLE 11

Synthesis of

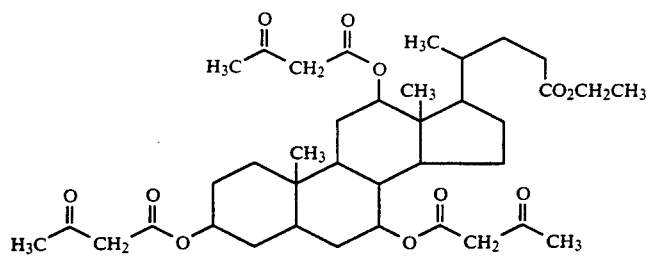

In a 100-ml three-necked flask equipped with a reflux condenser, a dropping funnel and a stirrer, 10 g (22.9 mmoles) of ethyl cholote, 30 ml of 1,4-dioxane, and 0.72 g (3.8 mmoles) of p-toluenesulfonic acid hydrate were placed and refluxed with heating, while 10 ml of a 1,4-dioxane solution containing 6.4 g (76 mmoles) of diketene was added thereto dropwise in about 40 minutes, followed by aging for 4 hours. After the reaction, the solvent was removed by distillation under reduced pressure. The residue was dissolved in diethyl ether, washed with water and a saturated saline solution and dried over anhydrous sodium sulfate. After removing the ether by distillation, the desired compound was obtained in yield of 13.1 g (19.0 mmoles).

EXAMPLE 12

Synthesis of

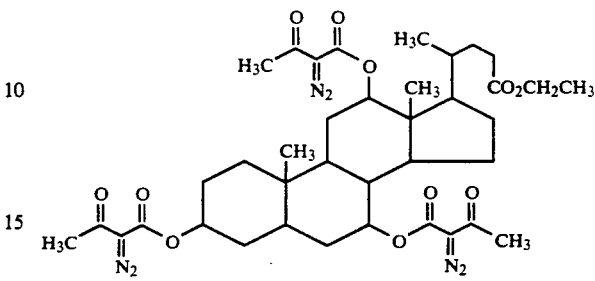

In a two-necked flask equipped with a reflux condenser and a stirrer, 13.1 g (19 mmoles) of the precursor obtained in Example 11, 9.1 ml (65 mmoles) of triethylamine and 20 ml of acetonitrile were placed, and 10 ml of acetonitrile solution containing 11.8 g (60 mmoles) of p-toluenesulfonylazide was added thereto dropwise at room temperature. The reaction solution generated heat gradually. After stirring at room temperature for 2 hours, the solvent was removed by distillation under reduced preccure, followed by extraction with diethyl ether. The diethyl ether solution was shaked several times with addition of an aqueous solution of potassium hydroxide to remove p-toluenesulfonylamide produced by the reaction. The resulting solution was washed with water and a saturated saline solution, and dried over anhydrous sodium sulfate. After removing the diethyl ether by distillation under reduced pressure, the desired compound was obtained as a yellow oily material in yield of 5.8 g (7.6 mmoles) (40% yield).

NMR spectrum (60 MHz, CDCl$_3$); A ($\delta$ 2.40, 2.44;

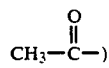

B ($\delta$ 3.90, quadruplet (6 Hz);

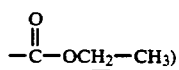

Intensity ratio A:B = 9:2

IR spectrum: A (2160 cm$^{-1}$; $\gamma$C=N$_2$) B (1720 cm$^{-1}$, 1680 cm$^{-1}$; $\gamma$C=O)

UV spectrum (in THF): $\lambda$max 258 nm, $\gamma$ 24000

EXAMPLE 13

Synthesis of

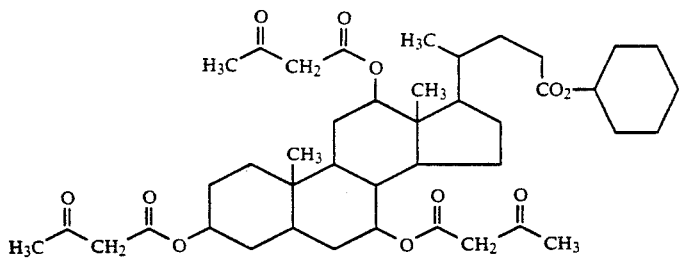

The process of Example 11 was repeated except for using 6.29 g (12.8 mmoles) of cyclohexyl cholate, 3.55 g (42.2 mmoles) of diketene and 0.5 g (2.5 mmoles) of p-toluenesulfonic acid hydrate.

EXAMPLE 14

Synthesis of

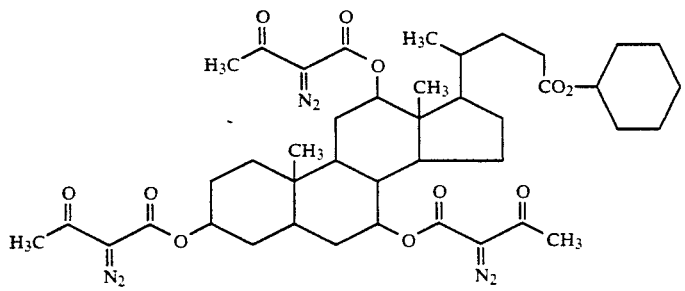

The diazotization of Example 12 was repeated except that the precursor obtained in Example 13 was not separated by column chromatography and reacted with 7.4 g (37.5 mmoles) of p-toluenesulfonylazide and 5.8 ml (41.3 mmoles) of triethylamine, and using 25 ml of acetonitrile as a solvent. The reaction product was recrystallized from a mixed solvent of ethyl acetate and n-hexane to give 1.72 g of the pure desired compound having a melting point of 99 to 101° C. as pale yellow crystals.

NMR spectrum (60 MHz, CDCl$_3$): A ($\delta$ 2.42, 2.40;

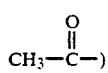

B ($\delta$ 4.07, multiplet (6 Hz);

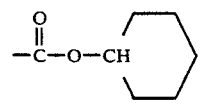

Intensity ratio A:B = 9:1

IR spectrum: A (2170 cm$^{-1}$; $\gamma$C=N$_2$) B (1730 cm$^{-1}$; 1680 cm$^{-1}$; $\gamma$C=O)

UV spectrum (in THF) $\lambda$max 259 nm, $\gamma$ 21400

EXAMPLE 15

Synthesis of

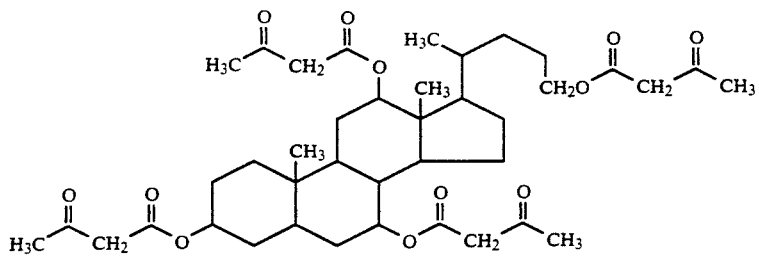

The process of Example 11 was repeated except for using 3.95 g (10 mmoles) of a tetravalent alcohol obtained by reducing the carboxyl group of cholic acid, 4.20 g (48 mmoles) of diketene, 0.92 g (4.8 mmoles) of p-toluenesulfonic acid hydrate and 40 ml of 1,4-dioxane as a solvent to give the desired compound.

EXAMPLE 16

Synthesis of

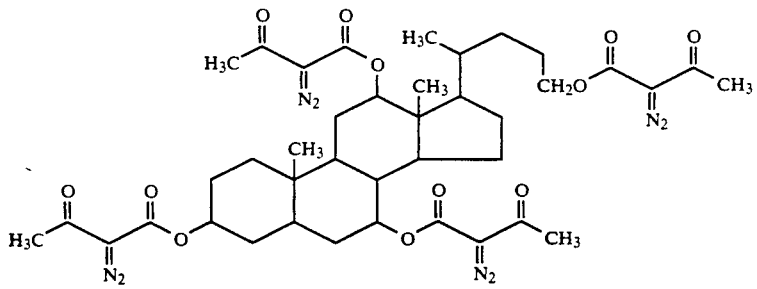

The process of Example 12 was repeated except for reacting the precursor obtained in Example 15 with 8.17 g (41.4 mmoles) of p-toluenesulfonylazide and 6.4 ml (45.5 mmoles) of triethylamine, and using 30 ml of acetonitrile as a solvent to give 5.18 g (6.20 mmoles) of the desired compound as a yellow oily material. The yield was 62% based on the tetravalent alcohol used in Example 15.

NMR spectrum (60 MHz, CDCl$_3$): ($\delta$ 2.41, 2.39, 2.37;

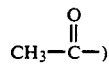

IR sepctrum: A (2160 cm$^{-1}$; $\gamma$C=N$_2$) B (1730 cm$^{-1}$, 1675 cm$^{-1}$; $\gamma$C=0)
UV spectrum (in THF): $\lambda$max 259 nm, $\gamma$ 28900

EXAMPLE 17

Synthesis of

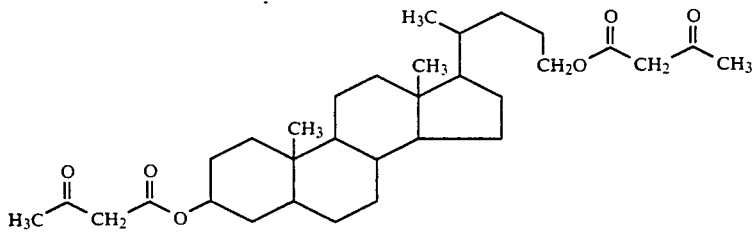

The process of Example 11 was repeated except for using 3.63 g (10 mmoles) of a bivalent alcohol obtained by reducing the carboxyl group of lithocholic acid, 2.02 g (24 mmoles) of diketene, 0.46 g (2.4 mmoles) of p-toluenesulfonic acid hydrate and 40 ml of 1,4-dioxane as a solvent to give 4.86 g of the desired compound.

EXAMPLE 18

Synthesis of

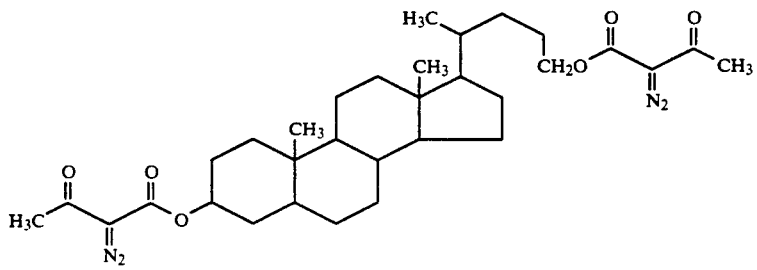

The process of Example 12 was repeated except for using the precursor obtained in Example 17, 3.97 g (20.2 mmoles) of p-toluenesulfonylazide, 3.1 ml (22.2 mmoles) of triethylamine and 20 ml of acetonitrile to give 3.17 g (5.44 mmoles) of the desired compound as a pale yellow oily material. The yield was 54% based on the bivalent alcohol used in Example 17.

NMR spectrum (60 MHz, CDCl$_3$): ($\delta$ 2.35, 2.30;

$$CH_3-\overset{O}{\underset{\|}{C}}-)$$

IR spectrum: A (2160 cm$^{-1}$; $\gamma$C=N$_2$) B (1740 cm$^{-1}$, 1675 cm$^{-1}$; $\gamma$C=0)
UV spectrum (in THF): $\lambda$max 258 nm, $\epsilon$ 14000

EXAMPLE 19

A photosensitive resin composition was prepared by mixing 80 parts of an alkali-soluble resin represented by the formula:

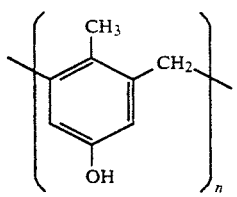 (V)

wherein n is 4–20, and 20 parts of α-diazoacetoacetic acid ester of the formula:

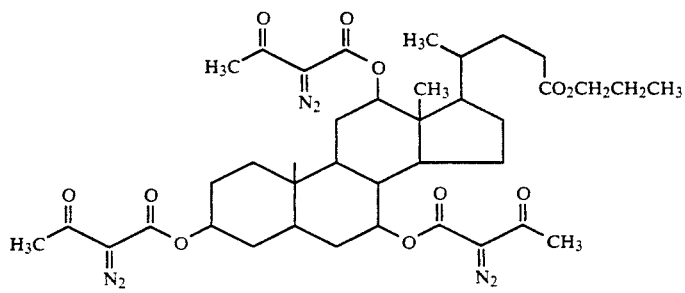

The resin composition was dissolved in 1-acetoxy-2-ethoxyethane (the solid content 28%) and spin coated on a silicon wafer, followed by prebaking at 85° C. for 30 minutes to form a resist film of 0.8 μm thick.

The film was exposed to KrF eximer laser light having various different irradiation dose, followed by development with an aqueous solution of tetramethylammonium hydroxide for 1 minute. After washing with water for 1 minute, the thickness of residual film was measured. The minimum light exposure amount (sensitivity) was obtained at the zero point of the residual film thickness by plotting residual film thicknesses (normalized) versus exposure amounts (mJ/cm$^2$). The sensitivity was about 100 mJ/cm$^2$. It was admitted that the resin composition of this Example provided a positive resist for KrF excimer laser with high sensitivity.

Then, the same resist film as obtained above was subjected to reductive projection exposure (about 150 mJ/cm$^2$) using a quartz mask, followed by the development under the same conditions as mentioned above to give resolution of 0.5 μm in lines and spaces. It was admitted that this resist had high resolution.

The silicon wafer on which the resist pattern had been formed mentioned above was subjected to CF$_4$ RIE using a parallel flat plate type RIE device (CF$_4$ pressure=0.04 torr, RF=0.32 W/cm ). The etching rate of the resist was as excellent as about 20 nm/min. It was admitted that the resist showed excellent resistance to RIE.

EXAMPLE 20

A photosensitive resin composition was prepared by mixing 80 parts of alkali-soluble resin represented by the formula:

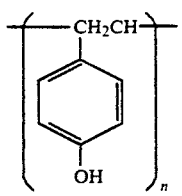 (VI)

wherein n is 10–80, and 20 parts of α-diazoacetoacetic acid ester of the formula:

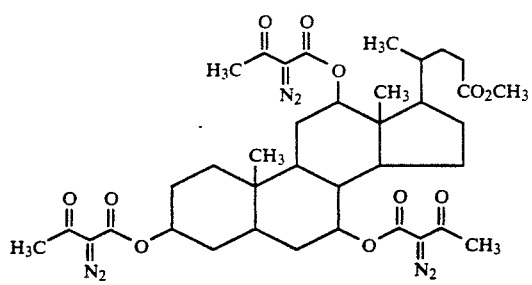

A resist film was prepared by using 1-acetoxy-2-ethoxyethane as a solvent and developed in the same manner as described in Example 19. The sensitivity was about 95 mJ/cm$^2$ and the resolution was 0.5 μm in lines and spaces. The etching rate for CF$_4$ RIE was as excellent as about 20 nm/min.

EXAMPLES 21 to 28

The process of Example 19 was repeated except for using the photosensitive resin compositions as listed in Table 2.

The sensitivity, the resolution and the CF$_4$ RIE rate were tested in the same manner as described in Example 19 and listed in Table 3.

TABLE 2

| Example No. | Base polymer | Sensitizer Compound | Amount (parts) |
|---|---|---|---|
| 21 | | | 30 |
| 22 | (structure shown) | (structure shown) | 10 |
| 23 | | | 30 |
| 24 | | (structure shown) | 20 |
| 25 | | | 10 |
| 26 | | | 30 |
| 27 | | (structure shown) | 20 |
| 28 | | | 10 |

TABLE 3

| Example No. | Sensitivity (mJ/cm$^2$) | Resolution ($\mu$m) | CF$_4$ RIE rate (nm/min) |
|---|---|---|---|
| 21 | 80 | 0.5 | 2.5 |
| 22 | 140 | 0.5 | 18 |
| 23 | 85 | 0.5 | 2.5 |
| 24 | 95 | 0.5 | 20 |
| 25 | 150 | 0.5 | 18 |
| 26 | 85 | 0.5 | 2.5 |
| 27 | 100 | 0.5 | 20 |
| 28 | 160 | 0.5 | 18 |

As mentioned above, the photosensitive resin compositions were excellent in the sensitivity, resolution and RIE resistance and can be used as a resist for KrF excimer laser lithgraphy suitable for obtaining the resolution of line width of 0.5 μm or less.

EXAMPLE 29

(a) Sensitivity

OFPR-800 (a trade name, mfd. by Tokyo Ohka Kogyo Co., Ltd.) was spin-coated on a silicon wafer and hardbaked to form a resist film of 2.0 μm thick. A photosensitive resin composition was prepared by mixing 80 parts of p-hydroxybenzylsilsesquioxane of the formula:

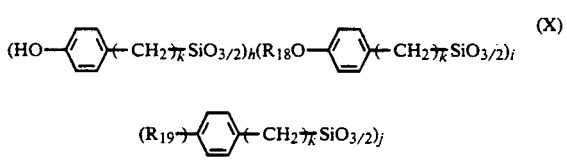

wherein $R_{18}$ is $CH_3$; $R_{19}$ is $Me_3Si$; k is 1; $h+i+j$ is 10–50; $h/(h+i+j)$ is 0.8–0.95, with 20 parts of α-diazoacetoacetic acid ester of the formula:

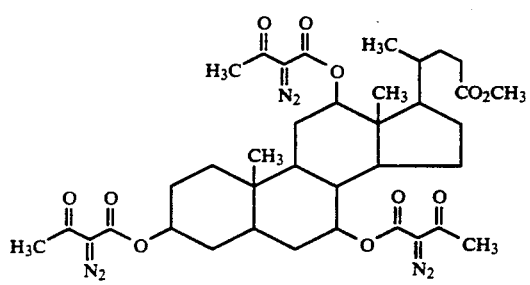

The resin composition was dissolved in 1-acetoxy-2-ethoxyethane, spin-coated on the above-mentioned Hardbaked OFPR-800 and baked at 85° C. for 30 minutes to form a resist film of 0.8 μm thick.

The resist film thus formed was exposed to various different irradiation doses of KrF excimer laser light. After development with an aqueous solution of 0.050N tetrakis(2-hydroxyethyl)ammonium hydroxide for 1 minute, the resulting resist film was washed with water for 1 minute and the residual resist film thickness was measured. The residual film thicknesses (normalized) were plotted versus the exposed amounts (mJ/cm$^2$) and the minimum light exposure amount (defined as sensitivity) was obtained at the zero point of the residual film thickness. The sensitivity was about 100 mJ/cm$^2$. It was admitted that the resist film was a positive resist for KrF excimer laser with high sensitivity.

(b) Resolution

The silicon wafer having the two resist layers thereon was exposed to KrF excimer laser light using a reductive expasure device, followed by development and rinsing as mentioned above (a). Resolution of 0.5 μm in lines and spaces was obtained. Thus, it was admitted that the photosensitive resin composition of this Example was able to provide a positive resist for KrF excimer laser with high resolution.

(c) Resistance to O$_2$ RIE

Oxygen plasma etching was conducted by using the upper layer resist as a mask and a parallel flat plate type O$_2$ RIE device (O$_2$ pressure = 20 mtorr, RF 200W (14 MHz), cathode bias −130 V). As a result, the upper layer resist pattern with 0.5 μm lines and spaces was transferred to the Hardbaked OFPR-800 precisely. The etching rate of the upper resist at this time was about 4 nm/min. It was admitted that the photosensitive resin composition of the present invention has excellent resistance to O$_2$ RIE.

EXAMPLES 30 to 46

The process of Example 29 was repeated except for using the photosensitive resin compositions as listed in Table 4, Hardbaked OFPR-800 as the bottom layer resist and the developing conditions (normality of aqueous solution of (HOCH$_2$CH$_2$)$_4$NOH) as shown in Table 4.

The sensitivity, the resolution and the O$_2$ RIE rate were tested in the same manner as described in Example 29 and listed in Table 5.

TABLE 4

| Example No. | Matrix polymer | Sensitizer Compound | Amount (parts) | Developing conditions. Normality |
|---|---|---|---|---|
| 30 | (HO—⟨⟩—(CH$_2$)$_K$SiO$_{3/2}$)$_h$ | [structure with CO$_2$CH$_3$] | 30 | 0.053 |
| 31 | (R$_{18}$O—⟨⟩—(CH$_2$)$_K$SiO$_{3/2}$)$_i$ | | 10 | 0.045 |
|  | (R$_{19}$O—⟨⟩—(CH$_2$)$_K$SiO$_{3/2}$)$_j$ | | | |
| 32 | R$_{18}$ = CH$_3$ | [structure with CO$_2$C$_2$H$_5$] | 30 | 0.053 |
| 33 | R$_{19}$ = Me$_3$Si | | 20 | 0.050 |
| 34 | K = 1 | | 10 | 0.045 |
|  | h + i + j = 10–50 | | | |
|  | h/(h + i + j) = 0.8–0.95 | | | |
| 35 | (HO—⟨⟩—(CH$_2$)$_K$SiO$_{3/2}$)$_h$ | [structure with CO$_2$C$_3$H$_7$] | 30 | 0.053 |
| 36 | (R$_{18}$O—⟨⟩—(CH$_2$)$_K$SiO$_{3/2}$)$_i$ | | 20 | 0.050 |
| 37 | (R$_{19}$O—⟨⟩—(CH$_2$)$_K$SiO$_{3/2}$)$_j$ | | 10 | 0.045 |
| 38 | R$_{18}$ = CH$_3$ | [structure with CO$_2$-cyclohexyl] | 30 | 0.053 |
| 39 | R$_{19}$ = Me$_3$Si | | 20 | 0.050 |
| 40 | K = 1 | | 10 | 0.045 |
|  | h + i + j = 10–50 | | | |
|  | h/(h + i + j) = 0.8–0.95 | | | |

TABLE 4-continued

| Example No | Matrix polymer | Sensitizer Compound | Amount (parts) | Developing conditions. Normality |
|---|---|---|---|---|
| 41 | (HO—⌬—(CH$_2$)$_k$SiO$_{3/2}$)$_h$ | [structure] | 30 | 0.060 |
| 42 | (R$_{18}$O—⌬—(CH$_2$)$_k$SiO$_{3/2}$)$_i$ | | 20 | 0.055 |
| 43 | (R$_{19}$O—⌬—(CH$_2$)$_k$SiO$_{3/2}$)$_j$ | [structure] | 10 | 0.050 |
| 44 | R$_{18}$ = CH$_3$ | [structure] | 30 | 0.050 |
| 45 | R$_{19}$ = Me$_3$Si | | 20 | 0.050 |
| 46 | k = 1 | | 10 | 0.045 |
| | h + i + j = 10–50 | | | |
| | h/(h + i + j) = 0.8–0.95 | | | |

TABLE 5

| Example No. | Sensitivity (mJ/cm$^2$) | Resolution (μm) | O$_2$ RIE rate (nm/min) |
|---|---|---|---|
| 30 | 80 | 0.5 | 6 |
| 31 | 150 | 0.5 | 2 |
| 32 | 80 | 0.5 | 6 |
| 33 | 100 | 0.5 | 4 |
| 34 | 160 | 0.5 | 2 |
| 35 | 85 | 0.5 | 6 |
| 36 | 120 | 0.5 | 4 |
| 37 | 170 | 0.5 | 2 |
| 38 | 85 | 0.5 | 6 |
| 39 | 120 | 0.5 | 4 |
| 40 | 180 | 0.5 | 2 |
| 41 | 80 | 0.5 | 6 |
| 42 | 100 | 0.5 | 4 |
| 43 | 140 | 0.5 | 2 |
| 44 | 100 | 0.5 | 6 |
| 45 | 150 | 0.5 | 4 |
| 46 | 200 | 0.5 | 2 |

As mentioned above, the photosensitive resin composition of the present invention can provide a resist for KrF excimer laser used in the bi-layer resist method with sufficient sensitivity, resolution and resistance to O$_2$ RIE.

What is claimed is:

1. An α-diazoacetoacetic acid ester of the formula:

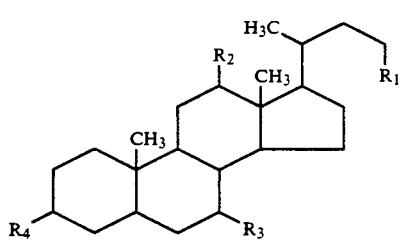

(I)

wherein R$_1$ is —CO$_2$R$_9$ or

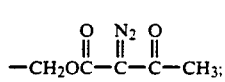

R$_2$, R$_3$ and R$_4$ are independently hydrogen, —OH or

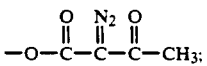

R$_9$ is an alkyl group having 1 to 10 carbon atoms; provided that at least one of R$_1$ through R$_4$ contains a moiety of the formula:

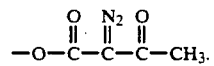

2. An α-diazoacetoacetic acid ester according to claim 1, which is represented by the formula:

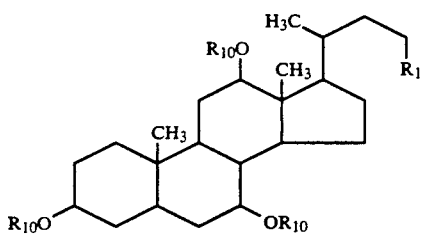

wherein R$_1$ is —CO$_2$R$_9$ or

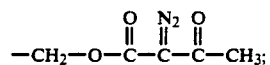

R$_9$ is an alkyl group having 1 to 10 carbon atoms; and R$_{10}$ is hydrogen or

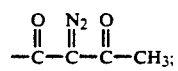

provided that at least one of R$_1$ and R$_{10}$ should contain the moiety of the formula:

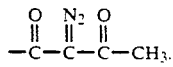

3. An α-diazoacetoacetic acid ester according to claim 1, which is represented by the formula:

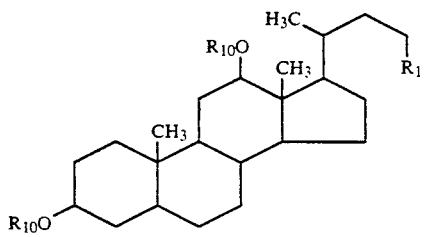

wherein $R_1$ is $-CO_2R_9$ or

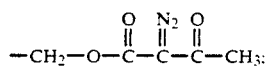

$R_9$ is an alkyl group having 1 to 10 carbon atoms; and $R_{10}$ is hydrogen or

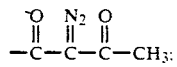

provided that at least one of $R_1$ and $R_{10}$ should contain the moiety of the formula:

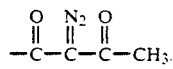

4. An α-diazoacetoacetic acid ester according to claim 1, which is represented by the formula:

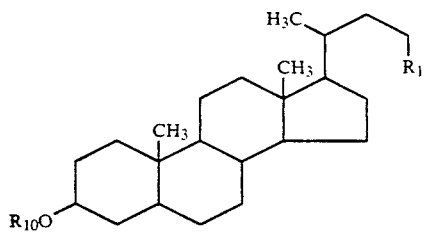

wherein $R_1$ is $-CO_2R_9$ or

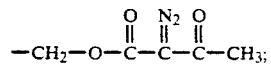

$R_9$ is an alkyl group having 1 to 10 carbon atoms; and $R_{10}$ is hydrogen or

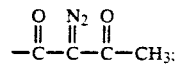

provided that at least one of $R_1$ and $R_{10}$ should contain the moiety of the formula:

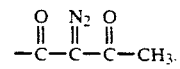

5. A photosensitive resin composition comprising an alkali-soluble resin and the α-diazoacetoacetic acid ester of claim 1 as a sensitizer.

6. A photosensitive resin composition according to claim 5, wherein the alkali-soluble resin is at least one member selected from those containing aromatic rings therein and represented by the formulae:

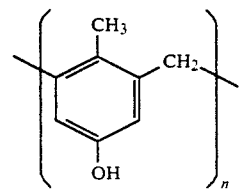

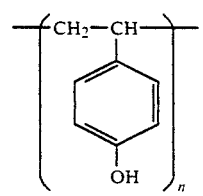

and

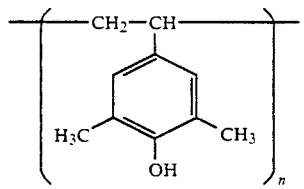

wherein n is an integer of 4 or more.

7. A photosensitive resin composition according to claim 5, wherein the alkali-soluble resin is at least one member selected from alkali-soluble organosilicon resins represented by the formulae:

$$\underset{(VIII)}{\left(\underset{\underset{\underset{OH}{\bigcirc}}{(CH_2)_d}}{\overset{R_{11}}{\underset{|}{Si}}}-O\right)_a\left(\underset{\underset{\underset{OR_{12}}{\bigcirc}}{(CH_2)_d}}{\overset{R_{11}}{\underset{|}{Si}}}-O\right)_b\left(\underset{\underset{\underset{OR_{13}}{\bigcirc}}{(CH_2)_d}}{\overset{R_{11}}{\underset{|}{Si}}}-O\right)_c}$$

$$\underset{(IX)}{\left(\underset{\underset{\underset{OH}{\bigcirc}}{R_{15}}}{\overset{R_{14}}{\underset{|}{Si}}}-\overset{H}{\underset{|}{C}}\right)_e\left(\underset{\underset{\underset{OR_{16}}{\bigcirc}}{R_{15}}}{\overset{R_{14}}{\underset{|}{Si}}}-\overset{H}{\underset{|}{C}}\right)_f\left(\underset{\underset{\underset{OR_{17}}{\bigcirc}}{R_{15}}}{\overset{R_{14}}{\underset{|}{Si}}}-\overset{H}{\underset{|}{C}}\right)_g}$$

$$(HO-\bigcirc-CH_2)_kSiO_{3/2})_h(R_{18}O-\bigcirc-CH_2)_kSiO_{3/2})_i \quad (X)$$

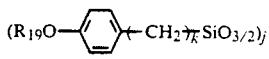

wherein $R_{11}$, $R_{12}$, $R_{14}$, $R_{15}$, $R_{16}$ and $R_{18}$ are independently an alkyl group having 1 to 6 carbon atoms; $R_{13}$, $R_{17}$ and $R_{19}$ are independently a trialkylsilyl group; d and k are independently 1 or 2; a, e and h are independently an integer of 1 or more; and b, c, f, g, i and j are independently zero or an integer of 1 or more, provided that $a/(a+b+c)$, $e/(e+f+g)$ and $h/(h+i+j)$ are 0.4 or more.

8. A photosensitive resin composition according to claim 5, wherein the photosensitive resin composition comprises 50 to 95 parts by weight of a resin represented by the formula:

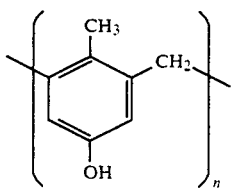

wherein n is an integer of 4 or more, and 50 to 5 parts by weight of a sensitizer represented by the formula:

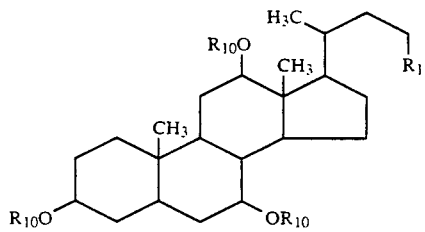

wherein $R_1$ is $-CO_2R_9$ or

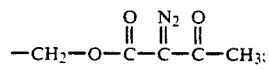

$R_9$ is an alkyl group having 1 to 10 carbon atoms; $R_{10}$ is hydrogen or

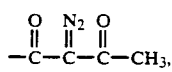

provided that at least one of $R_1$ and $R_{10}$ should contain the moiety of the formula:

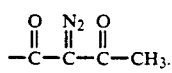

9. A photosensitive resin composition according to claim 7, wherein the photosensitive resin composition comprises 50 to 95 parts by weight of a resin represented by the formula:

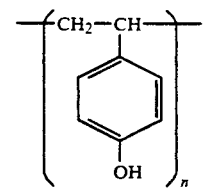

wherein n is an integer of 4 or more, and 50 to 5 parts by weight of a sensitizer represented by the formula:

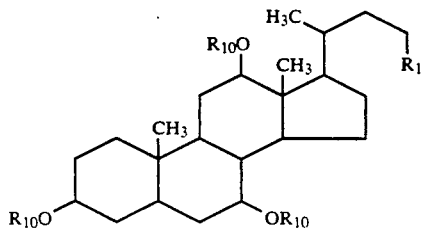

wherein $R_1$ is $-CO_2R_9$ or

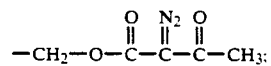

$R_9$ is an alkyl group having 1 to 10 carbon atoms; $R_{10}$ is hydrogen or

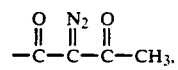

provided that at least one of $R_1$ and $R_{10}$ should contain the moiety of the formula:

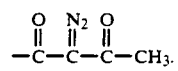

10. A photosensitive resin composition according to claim 5, wherein the photosensitive resin composition comprises 60 to 95 parts by weight of a silicone resin represented by the formula:

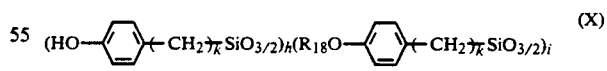

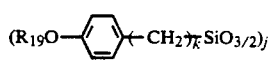

wherein $R_{18}$ is an alkyl group having 1 to 6 carbon atoms; $R_{19}$ is a trialkylsilyl group; k is 1 or 2; h is an integer of 1 or more; i and j are independently zero or an integer of 1 or more, provided that $h/(h+i+j)$ is 0.4 or more, and 40 to 5 parts by weight of a sensitizer represented by the formula:

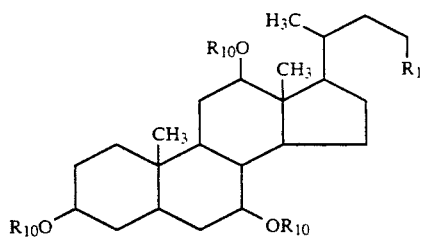

wherein R₁ is —CO₂R₉ or

R₉ is an alkyl group having 1 to 10 carbon atoms; R₁₀ is hydrogen or

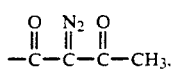

provided that at least one of R₁ and R₁₀ should contain the moiety of the formula:

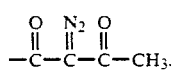

11. A photosensitive resin composition according to claim 5, wherein the photosensitive resin composition comprises 60 to 95 parts by weight of a silicone resin represented by the formula:

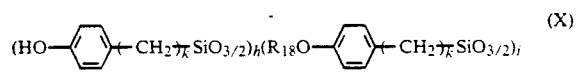

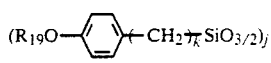

wherein R₁₈ is an alkyl group having 1 to 6 carbon atoms; R₁₉ is a trialkylsilyl group; k is 1 or 2; h is an integer of 1 or more; i and j are independently zero or an integer of 1 or more, provided that h/(h+i+j) is 0.4 or more, and 40 to 5 parts by weight of a sensitizer represented by the formula:

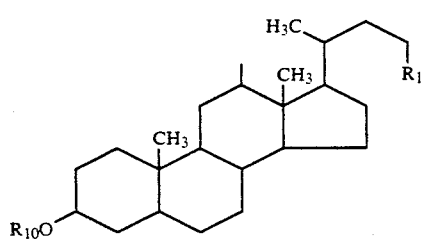

where R₁ is —CO₂R₉ or

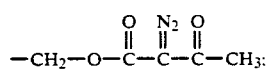

R₉ is an alkyl group having 1 to 10 carbon atoms; and R₁₀ is hydrogen or

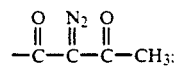

provided that at least one of R₁ and R₁₀ should contain the moiety of the formula:

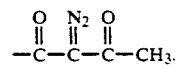

12. An α-diazoacetoacetic acid ester according to claim 1, wherein R₁, R₂, R₃, and R₄ in the formula (I) are respectively 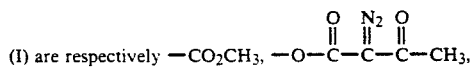

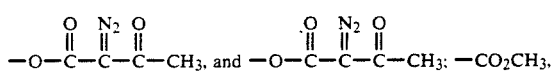

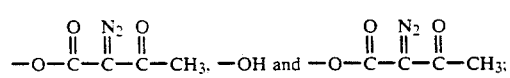

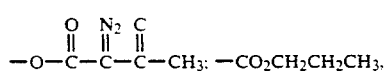

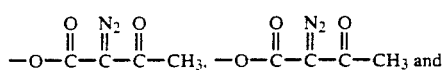

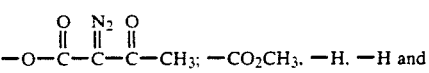

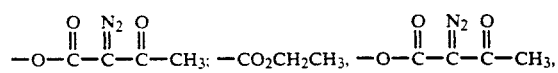

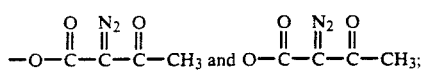

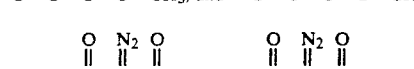

* * * * *